(12) United States Patent
Chen

(10) Patent No.: US 10,135,134 B2
(45) Date of Patent: Nov. 20, 2018

(54) ANTENNA SYSTEM FOR RECEIVING AND TRANSMITTING WIRELESS SIGNALS

(71) Applicant: RichWave Technology Corp., Taipei (TW)

(72) Inventor: Chih-Sheng Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 204 days.

(21) Appl. No.: 15/093,748

(22) Filed: Apr. 8, 2016

(65) Prior Publication Data

US 2016/0226140 A1    Aug. 4, 2016

Related U.S. Application Data

(63) Continuation-in-part of application No. 13/923,385, filed on Jun. 21, 2013, now Pat. No. 9,343,807.

(30) Foreign Application Priority Data

Jun. 21, 2012    (TW) ............................. 101122192 A

(51) Int. Cl.
| | | |
|---|---|---|
| *H01Q 1/50* | (2006.01) | |
| *H01Q 1/52* | (2006.01) | |
| *H04B 1/00* | (2006.01) | |
| *H04B 1/18* | (2006.01) | |
| *H03H 7/46* | (2006.01) | |

(52) U.S. Cl.
CPC ........... *H01Q 1/525* (2013.01); *H04B 1/0053* (2013.01); *H04B 1/18* (2013.01); *H03H 7/461* (2013.01)

(58) Field of Classification Search
CPC ............ H01Q 1/243; H01Q 1/38; H01Q 9/42; H01Q 9/145; H01Q 9/30
USPC .................. 343/860, 745, 850, 852, 876
See application file for complete search history.

(56) References Cited

U.S. PATENT DOCUMENTS

| | | | | |
|---|---|---|---|---|
| 3,842,360 A | * | 10/1974 | Dickens | .................. H03F 7/04 |
| | | | | 257/480 |
| 6,862,441 B2 | | 3/2005 | Ellä | |
| 7,109,825 B2 | | 9/2006 | Song | |
| 7,865,159 B2 | | 1/2011 | Dean | |
| 2004/0242165 A1 | | 12/2004 | Jedeloo | |
| 2008/0036689 A1 | * | 2/2008 | Leisten | .................. H01Q 1/242 |
| | | | | 343/895 |
| 2008/0305750 A1 | | 12/2008 | Alon | |
| 2009/0262034 A1 | * | 10/2009 | Satoh | ...................... H03H 7/00 |
| | | | | 343/745 |
| 2010/0003941 A1 | * | 1/2010 | Kojima | ................... H04B 1/48 |
| | | | | 455/269 |
| 2010/0260082 A1 | | 10/2010 | Lum | |
| 2012/0142286 A1 | | 6/2012 | Mitomo | |

FOREIGN PATENT DOCUMENTS

CN            202435391 U        9/2012

* cited by examiner

*Primary Examiner* — Dameon E Levi
*Assistant Examiner* — Collin Dawkins
(74) *Attorney, Agent, or Firm* — Winston Hsu

(57) ABSTRACT

An antenna system includes N integrated passive components (IPCs). A first end of each IPC of the N IPCs is directly configured to couple to an antenna for receiving signals of a band corresponding to the IPC and filtering signals of bands corresponding to other IPCs of the N IPCs. The antenna system can prevent signals of various bands from interfering with each other, reduces parasitic capacitance effect, and further improves nonlinear distortion.

17 Claims, 13 Drawing Sheets

ANTENNA SYSTEM FOR RECEIVING AND TRANSMITTING WIRELESS SIGNALS

CROSS REFERENCE TO RELATED APPLICATION

This is a continuation-in-part application of U.S. application Ser. No. 13/923,385, filed on Jun. 21, 2013, which is included herein by reference.

TECHNICAL FIELD

The present invention relates to an antenna system for receiving and transmitting wireless signals, especially relating to an antenna system capable of improving nonlinear distortion of signals.

BACKGROUND

When a practical antenna system is transmitting signals, a certain amount of power distortion is inevitable. For example, an antenna system transmits a 1 dBm (decibel milliwatt) signal, if power loss of the antenna system is 0.5 dBm, output signal of the antenna system will be 0.5 dBm. However, nonlinear distortion may occur in antenna systems when transmitting higher power output signals. For example, when the antenna system transmits a 10 dBm signal, the power loss is increased to 1.5 dBm from the former 0.5 dBm, thus the output signal will be 8.5 dBm. This causes distortions to occur in signals.

FIG. 1 is a diagram showing curves of output power relative to input power of antenna systems, wherein the inclined dotted line represents a curve without distortion of output power (Pout) relative to input power (Pin), and the solid line represents a curve with distortion of Pout relative to Pin. When the difference between Pout without distortion and Pout with distortion reaches 1 dBm, the corresponding Pin is so-called P1 dBm. When a signal's Pin reaches P1 dBm, distortion of its output signal could be severe. Therefore, distortion extent of output signal can be determined when Pin reaches P1 dBm. Besides, if P1 dBm is enhanced with reduced interference and parasitic capacitance effects, Pout will reach P1 dBm point until higher power, thus improving nonlinear distortion of the signal.

Integrated Passive Components (IPCs) are attracting an increasing interest due to needs of handheld wireless devices to decrease in size and cost and increase in functionality. Many functional blocks such as impedance matching circuits, harmonic filters, couplers, baluns and power combiner/divider can be realized by IPCs technology. IPCs are generally fabricated using standard wafer fab technologies such as thin film and photolithography processing.

SUMMARY

An embodiment of the present invention provides an antenna system for receiving and transmitting wireless signals. The antenna system includes N integrated passive components (IPCs), and N bypass switches, wherein N is an integer greater than 1, and an $N^{th}$ bypass switch is coupled to an $N^{th}$ IPC of the N IPCs correspondingly. Each IPC of the N IPCs is configured to couple to an antenna for receiving a predetermined band wireless signal corresponding to the each IPC from the antenna and filtering other band wireless signals corresponding to other IPCs of the N IPCs. The each IPC includes a choker and an impedance inverter, wherein the impedance inverter is coupled to the choker. The choker is used for choking the other band wireless signals, and the impedance inverter has an electrical length corresponding to ¼ wavelength of the predetermined band wireless signal.

The present invention provides an antenna system. The antenna system can prevent various band wireless signals from interfering with each other to improve nonlinear distortion of the antenna system. In addition, the antenna system of the present invention can also reduce parasitic capacitance effect.

DETAILED DESCRIPTION

Figure 1:
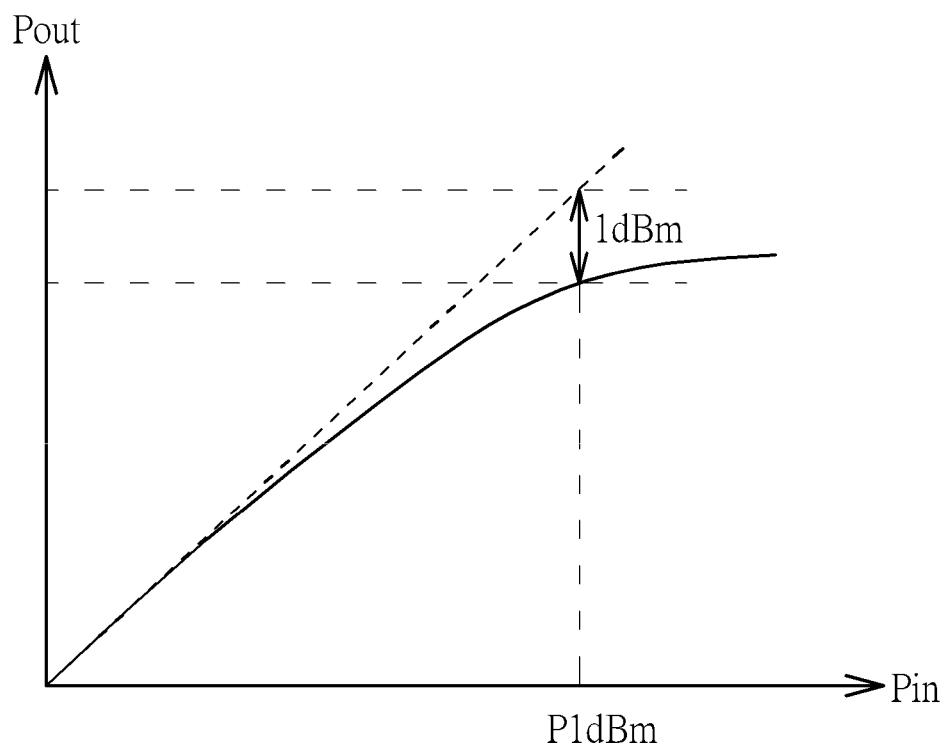
FIG. 1 is a diagram showing curves of output power relative to input power of antenna systems.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 2:
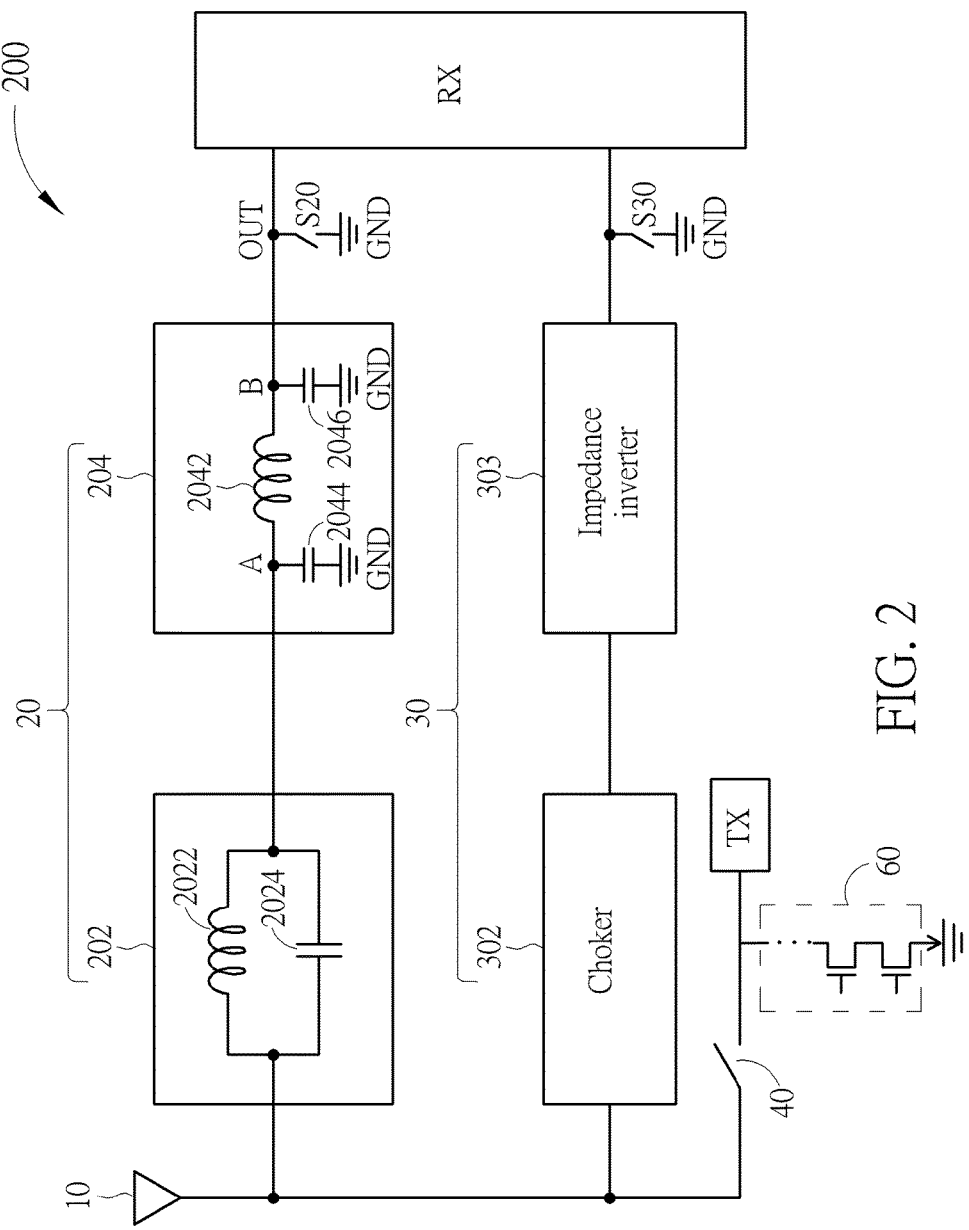
FIG. 2 is a diagram illustrating an antenna system for receiving and transmitting wireless signals according to a first embodiment of the present invention.

Please refer to FIG. 2. FIG. 2 is a diagram illustrating an antenna system 200 for receiving and transmitting wireless signals according to a first embodiment of the present invention. As shown in FIG. 2, the antenna system 200 includes integrated passive components (IPC) 20, 30, a transmitting switch 40, a receiver RX, a transmitter TX, the bypass switches S20, S30, and a set of serially connected switches 60, wherein an impedance of the receiver RX is 50Ω. But, the present invention is not limited to the antenna system 200 only including the IPCs 20, 30. That is to say, the antenna system 200 can include a plurality of IPCs. First terminals of the IPCs 20, 30 are configured to couple to an antenna 10, wherein the IPC 20 is used for receiving a band wireless signal (e.g. 2.4G band wireless signal) corresponding to the IPC 20 from the antenna 10 and the IPC 30 is used for receiving a band wireless signal (e.g. 5G band wireless signal) corresponding to the IPC 30 from the antenna 10. When the antenna 10 receives 2.4G band wireless signal, the IPC 20 can filter 5G band wireless signal; and when the antenna 10 receives 5G band wireless signal, the IPC 30 can filter 2.4G band wireless signal. A first end of the transmitting switch 40 is configured to couple to the antenna 10, wherein when transmitting switch 40 is turned on, the transmitter TX can transmit wireless signals to the antenna 10 through the transmitting switch 40.

As shown in FIG. 2, the IPC 20 includes a choker 202 and an impedance inverter 204. The choker 202 is coupled between the impedance inverter 204 and the antenna 10, the impedance inverter 204 is coupled between the choker 202 and the receiver RX, the bypass switch S20 is coupled between an output terminal OUT of the IPC 20 and a reference potential (e.g. ground GND), and the choker 202 is not directly electrically connected to the reference potential, wherein a turning-on impedance of the bypass switch S20 is greater than ten times a turning-on impedance of the transmitting switch 40. A gate width of the bypass switch S20 can be configured to be much smaller than those of ordinary radio frequency (RF) switches, e.g. the transmitting switch 40. Thus, the bypass switch S20 has a smaller area than the ordinary RF switches, and compared to the ordinary RF switches, parasitic capacitance effects of the bypass switch S20 will not be significant.

As shown in FIG. 2, the choker 202 includes a first inductor 2022 and a first capacitor 2024, wherein the first inductor 2022 is coupled between the impedance inverter 204 and the antenna 10, and the first capacitor 2024 is connected to the first inductor 2022 in parallel. The impedance inverter 204 includes a second inductor 2042, a second capacitor 2044, and a third capacitor 2046, wherein the second inductor 2042 is coupled between the choker 202 and the bypass switch S20, the second capacitor 2044 is coupled between a node A between the choker 202 and the second inductor 2042 and the reference potential, the third capacitor 2046 is coupled between a node B between the second inductor 2042 and the bypass switch S20 and the reference potential, and when the antenna 10 receives 2.4G band wireless signal, the impedance inverter 204 is equivalent to a low-pass n-type filter. The choker 202 is used for choking other band wireless signals different from 2.4G band wireless signal; and the impedance inverter 204 has an electrical length corresponding to ¼ wavelength of 2.4G band wireless signal.

When the antenna 10 receives 2.4G band wireless signal, the bypass switch S20 is turned off, so an equivalent impedance of the impedance inverter 204 seen from the antenna 10 is equal to a square of an impedance of the impedance inverter 204 divided by the impedance of the receiver RX. In one embodiment of the present invention, the impedance of the impedance inverter 204 is 50Ω, and the impedance of the receiver RX is also 50Ω. That is to say, the equivalent impedance of the impedance inverter 204 is 50*50/50=50Ω. Because when the antenna 10 receives 2.4G band wireless signal, the choker 202 cannot choke 2.4G band wireless signal, and the impedance inverter 204 has 50Ω equivalent impedance, 2.4G band wireless signal received by the antenna 10 can be transmitted to the receiver RX through the choker 202 and the impedance inverter 204.

In addition, when the antenna 10 receives 2.4G band wireless signal corresponding to the IPC 20, an equivalent impedance of the IPC 30 and an equivalent impedance of the transmitting switch 40 seen from the antenna 10 had better be infinite. That is to say, seen from the antenna 10, the IPC 30 and the transmitting switch 40 need to be open-circuited, so as to prevent from interference at the IPC 20 during wireless signal transmission. Thus, the transmitting switch 40 needs to be turned off. Because a choker 302 of the IPC 30 can filter 2.4G band wireless signal, the IPC 30 can be seen as an open circuit. But, if the bypass switches S30 is optionally turned on to let 2.4G band wireless signal, which is not completely filtered by the choker 302, being inputted to the reference potential GND, the IPC 30 can further completely filter 2.4G band wireless signal. Thus, when the antenna 10 receives 2.4G band wireless signal, 2.4G band wireless signal can be completely received by the receiver RX through the choker 202 and the impedance inverter 204, instead of a part of 2.4G band wireless signal being inputted to the reference potential GND, and does not also be transmitted to the transmitter TX through the transmitting switch 40 or to the receiver RX through the IPC 30.

In addition, structures of the choker 302 and an impedance inverter 303 included in the IPC 30 are identical to structures of the choker 202 and the impedance inverter 204 of the IPC 20, so further description thereof is omitted for simplicity. In addition, coupling relationships between the choker 302, the impedance inverter 303, and the bypass switches S30 are identical to coupling relationships between the choker 202, the impedance inverter 204, and the bypass switch S20, so further description thereof is omitted for simplicity. Therefore, when the antenna 10 receives 5G band wireless signal corresponding to the IPC 30, the bypass switches S30 is turned off, so an equivalent impedance of the impedance inverter 303 seen from the antenna 10 is 50Ω. In addition, when the antenna 10 receives 5G band wireless signal, an equivalent impedance of the IPC 20 and the equivalent impedance of the transmitting switch 40 seen from the antenna 10 had better be infinite. That is to say, seen from the antenna 10, the IPC 20 and the transmitting switch 40 need to be open-circuited, so as to prevent from interference at the IPC 30 during wireless signal transmission. Thus, the transmitting switch 40 needs to be turned off. Because the IPC 20 can filter 5G band wireless signal, the IPC 20 can be seen as an open circuit. But, if the bypass switches S20 is optionally turned on to let 5G band wireless signal, which is not completely filtered by the choker 202, being inputted to the reference potential GND, the IPC 20 can further completely filter 5G band wireless signal. Thus, when the antenna 10 receives 5G band wireless signal, 5G band wireless signal can be completely received by the receiver RX through the choker 302 and the impedance inverter 303, instead of a part of 5G band wireless signal being inputted to the reference potential GND, and does not also be transmitted to the transmitter TX through the transmitting switch 40 or to the receiver RX through the IPC 20.

As shown in FIG. 2, the receiver RX is coupled to output terminals of the IPCs 20, 30 for processing 2.4G band wireless signal and 5G band wireless signal transmitted by the IPCs 20, 30, respectively. That is to say, the receiver RX has a multiplexing function. The transmitter TX is coupled to the transmitting switch 40 for transmitting wireless signals to the antenna 10 through the transmitting switch 40 during turning-on of the transmitting switch 40.

When the transmitter TX transmits 2.4G band wireless signal, the bypass switch S20 and the transmitting switch 40 are turned on to make 2.4G band wireless signal be transmitted by the antenna 10 through the transmitting switch 40, and because the equivalent impedance of the IPC 20 seen from the antenna 10 is infinite after the bypass switch S20 is turned on (that is, the equivalent impedance of the IPC 20 is equal to $ZO^2/ZL$, wherein ZO is the impedance (50Ω) of the impedance inverter 204 of the IPC 20 corresponding to ¼ wavelength of 2.4G band wireless signal, ZL is an impedance of a load coupled to the IPC 20, and ZL is equal to zero because the bypass switch S20 is turned on, resulting in the equivalent impedance of the IPC 20 is infinite), so the receiver RX does not receive 2.4G band wireless signal transmitted by the transmitter TX. In addition, when the transmitter TX transmits 2.4G band wireless signal, the bypass switches S30 can be optionally turned on or turned off. Because even the bypass switches S30 is turned off, the choker 302 of the IPC 30 also filters 2.4G band wireless signal to make the receiver RX not receive 2.4G band wireless signal transmitted by the transmitter TX. Similarly, when the transmitter TX transmits 5G band wireless signal, the bypass switches S30 and the transmitting switch 40 are turned on, and the bypass switch S20 can be optionally turned on or turned off to make the 5G band wireless signal be transmitted by the antenna 10 through the transmitting switch 40.

The set of serially connected switches 60 is coupled between the transmitting switch 40 and the reference potential, and can be configured to include multiple switches connected in series shown in FIG. 2. But, the present invention is not limited to an amount of the multiple switches connected in series included in the set of serially connected switches 60. That is, the set of serially connected switches 60 can also be configured to include only one switch. The amount of the multiple switches connected in series is determined according to power level of the transmitter TX. If the transmitter TX has higher power level, the set of serially connected switches 60 needs more switches connected in series.

Because when the antenna system 200 receives 2.4G band wireless signal, the antenna system 200 can filter 5G band wireless signal, or when the antenna system 200 receives 5G band wireless signal, the antenna system 200 can filter 2.4G band wireless signal, the antenna system 200 can prevent various band wireless signals from interfering with each other, that is, the antenna system 200 can improve nonlinear distortion of the prior art. In addition, because the bypass switches S20, S30 have higher turning-on impedances and smaller gate widths, the bypass switches S20, S30 have lower parasitic capacitance effects.

Figure 3:
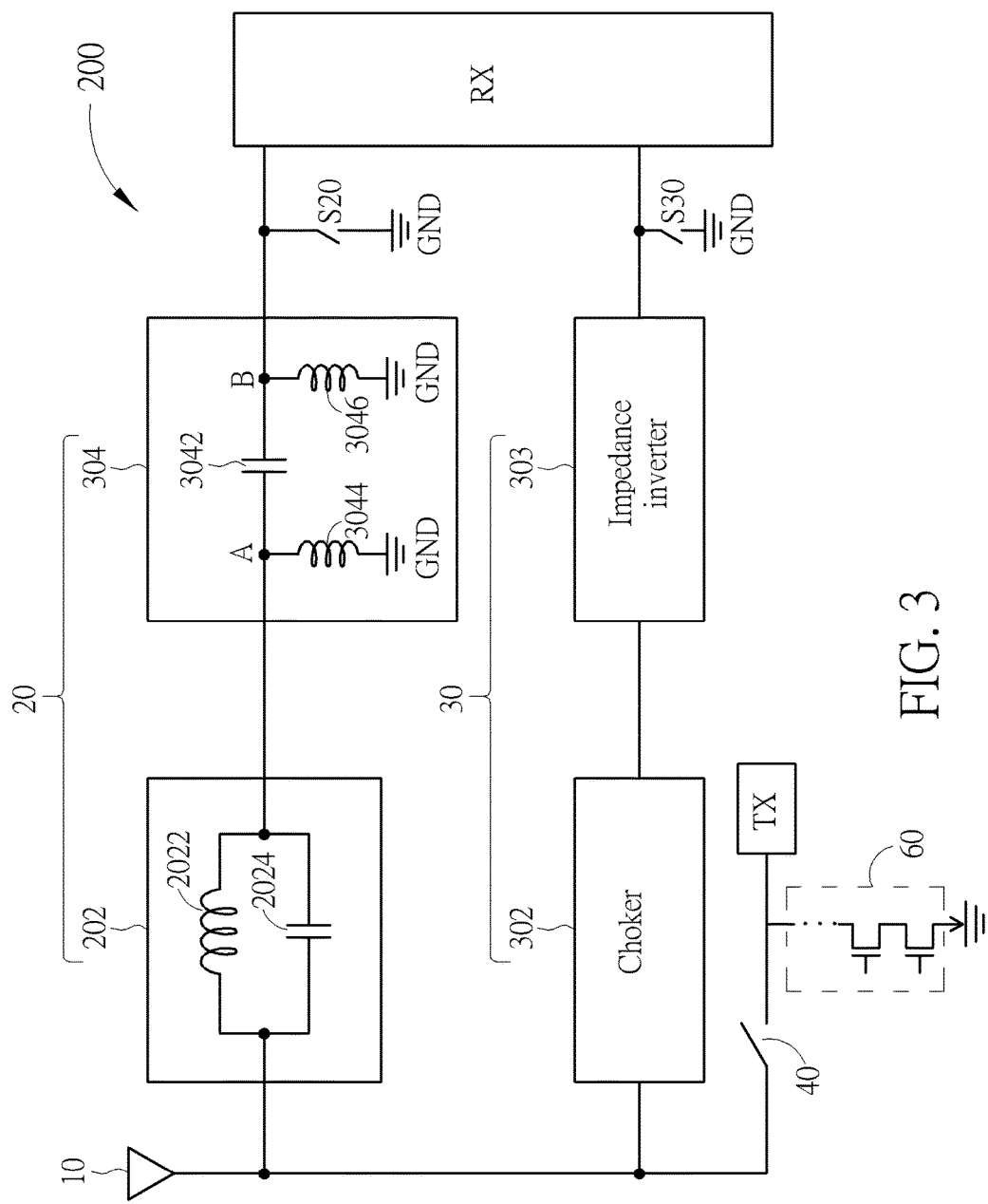
FIG. 3 is a diagram illustrating an impedance inverter applied to the antenna system according to a second embodiment of the present invention.

Please refer to FIG. 3. FIG. 3 is a diagram illustrating an impedance inverter 304 applied to the antenna system 200 according to a second embodiment of the present invention. As shown in FIG. 3, the impedance inverter 304 includes a second capacitor 3042, a second inductor 3044, and a third inductor 3046, wherein the second capacitor 3042 is coupled between the choker 202 and the bypass switch S20, the second inductor 3044 is coupled between a node A between the choker 202 and the second capacitor 3042 and the reference potential, the third inductor 3046 is coupled between a node B between the second capacitor 3042 and the receiver RX and the reference potential, and when the antenna 10 receives 2.4G band wireless signal, the impedance inverter 304 is also equivalent to a high-pass π-type filter. Because operational principles of the impedance inverter 304 are identical to those of the impedance inverter 204, so further description thereof is omitted for simplicity.

Figure 4:
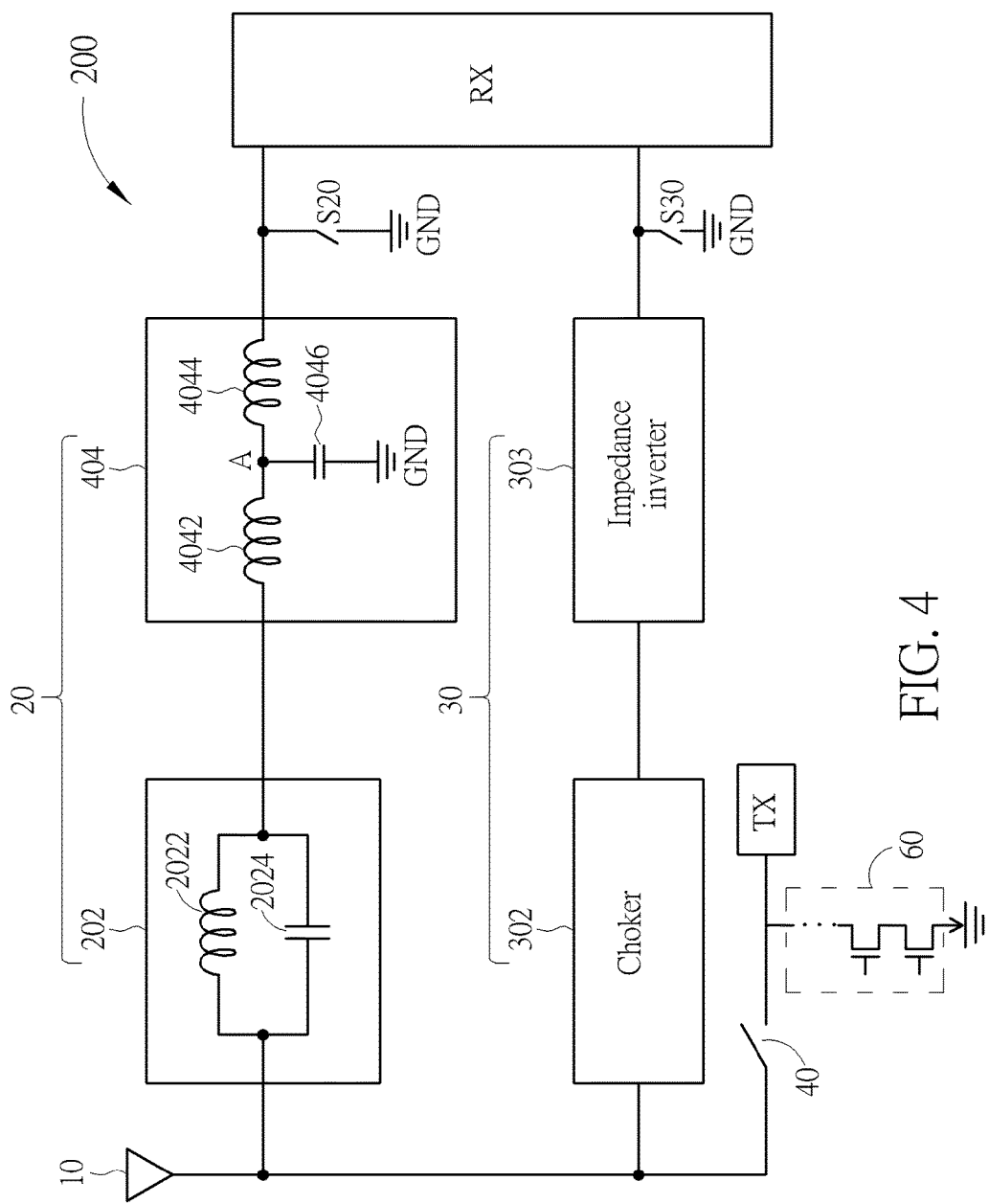
FIG. 4 is a diagram illustrating an impedance inverter applied to the antenna system according to a third embodiment of the present invention.

Please refer to FIG. 4. FIG. 4 is a diagram illustrating an impedance inverter 404 applied to the antenna system 200 according to a third embodiment of the present invention. As shown in FIG. 4, the impedance inverter 404 includes a second inductor 4042, a third inductor 4044, and a second capacitor 4046, wherein the second inductor 4042 is coupled to the choker 202, the third inductor 4044 is coupled between the second inductor 4042 and the bypass switch S20, the second capacitor 4046 is coupled between a node A between the second inductor 4042 and the third inductor 4044 and the reference potential, and when the antenna 10 receives 2.4G band wireless signal, the impedance inverter 404 is equivalent to a low-pass T-type filter. Because operational principles of the impedance inverter 404 are identical to those of the impedance inverter 204, so further description thereof is omitted for simplicity.

Figure 5:
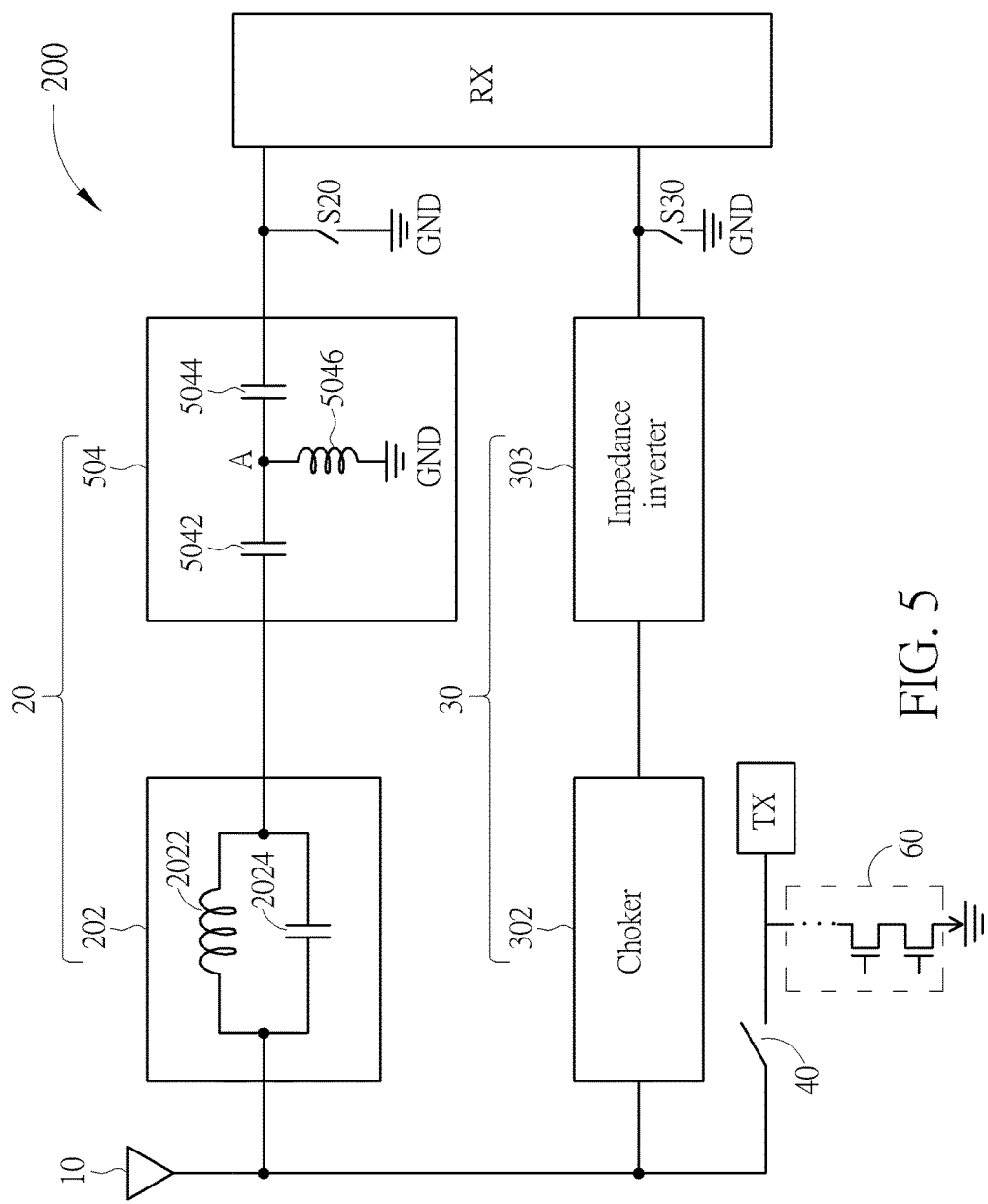
FIG. 5 is a diagram illustrating an impedance inverter applied to the antenna system according to a fourth embodiment of the present invention.

Please refer to FIG. 5. FIG. 5 is a diagram illustrating an impedance inverter 504 applied to the antenna system 200 according to a fourth embodiment of the present invention. As shown in FIG. 5, the impedance inverter 504 includes a second capacitor 5042, a third capacitor 5044, and a second inductor 5046, wherein the second capacitor 5042 is coupled to the choker 202, the third capacitor 5044 is coupled between the second capacitor 5042 and the bypass switch S20, the second inductor 5046 is coupled between a node A between the second capacitor 5042 and the third capacitor 5044 and the reference potential, and when the antenna 10 receives 2.4G band wireless signal, the impedance inverter 504 is equivalent to a high-pass T-type filter. Because operational principles of the impedance inverter 504 are identical to those of the impedance inverter 204, so further description thereof is omitted for simplicity.

Figure 6:
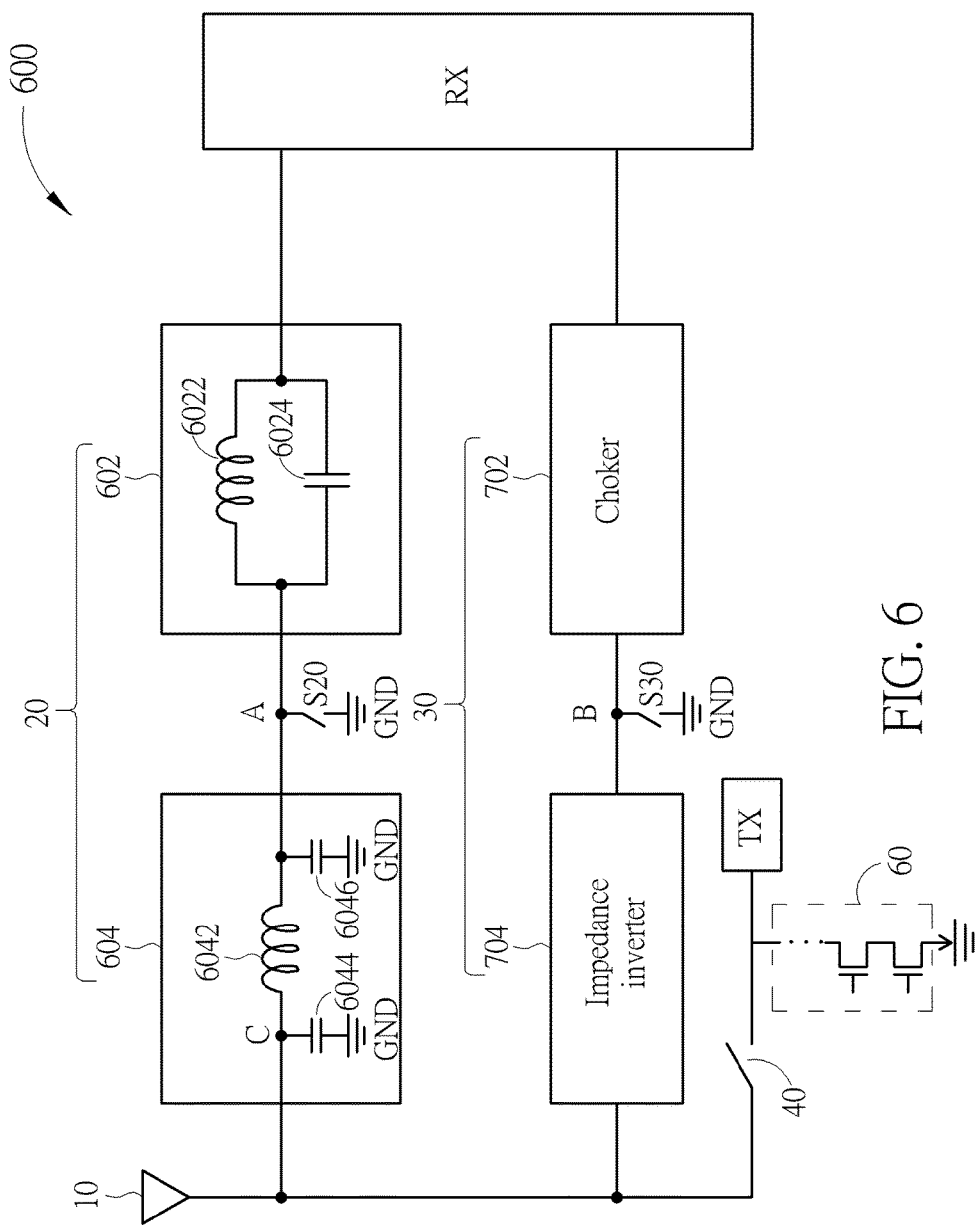
FIG. 6 is a diagram illustrating an antenna system for receiving and transmitting wireless signals according to a fifth embodiment of the present invention.

Please refer to FIG. 6. FIG. 6 is a diagram illustrating an antenna system 600 for receiving and transmitting wireless signals according to a fifth embodiment of the present invention. As shown in FIG. 6, differences between the antenna system 600 and the antenna system 200 are that an impedance inverter 604 of the IPC 20 is coupled between a choker 602 of the IPC 20 and the antenna 10, the choker 602 is coupled between the impedance inverter 604 and the receiver RX, and the bypass switch S20 is coupled between a node A between the impedance inverter 604 and the choker 602 and the reference potential; and an impedance inverter 704 of the IPC 30 is coupled between the choker 702 and the antenna 10, a choker 702 of the IPC 30 is coupled between the impedance inverter 704 and the receiver RX, and the bypass switches S30 is coupled between a node B between the impedance inverter 704 and the choker 702 and the reference potential.

As shown in FIG. 6, the choker 602 includes a first inductor 6022 and a first capacitor 6024, wherein the first inductor 6022 is coupled to the impedance inverter 604 and the bypass switch S20, and the first capacitor 6024 is connected to the first inductor 6022 in parallel; the impedance inverter 604 includes a second inductor 6042, a second capacitor 6044, and a third capacitor 6046, wherein the second inductor 6042 is coupled between the node A between the choker 602 and the bypass switch S20 and the antenna 10, the second capacitor 6044 is coupled between a node C between the second inductor 6042 and the antenna 10 and the reference potential, the third capacitor 6046 is coupled between the node A between the choker 602 and the bypass switch S20 and the reference potential, and when the antenna 10 receives 2.4G band wireless signal, the impedance inverter 604 is equivalent to a low-pass π-type filter.

When the antenna 10 receives 5G band wireless signal corresponding to the IPC 30, the bypass switches S30 is turned off, so an equivalent impedance of the impedance inverter 704 seen from the antenna 10 is equal to 50Ω. In addition, when the antenna 10 receives 5G band wireless signal, the equivalent impedance of the IPC 20 and the equivalent impedance of the transmitting switch 40 seen from the antenna 10 had better be infinite. That is to say, seen from the antenna 10, the IPC 20 and the transmitting switch 40 need to be open-circuited, so as to prevent from interference at the IPC during wireless signal transmission. Because the impedance inverter 604 of the IPC 20 has an electrical length corresponding to ¼ wavelength of 2.4G band wireless signal, when the bypass switch S20 is turned off and the antenna 10 receives 5G band wireless signal corresponding to the IPC 30, the equivalent impedance of the IPC 20 seen from the antenna 10 is infinite, that is, the IPC 20 can be seen as an open circuit. Therefore, when the antenna 10 receives 5G band wireless signal corresponding to the IPC 30, the impedance inverter 604 can be seen as a transmission line corresponding to ½ wavelength of 5G band wireless signal (that is, a sum of two ¼ wavelengths corresponding to 5G band wireless signal). Thus, because the bypass switch S20 is turned off (that is, the bypass switch S20 can be seen as an open circuit), and an equivalent impedance of the choker 602 seen from the bypass switch S20 is infinite (that is, the choker 602 can be seen as an open circuit to 5G band wireless signal), the equivalent impedance of the IPC 20 seen from the antenna 10 is infinite according to the Smith chart, resulting in the IPC 20 being seen as an open circuit. Thus, when the antenna 10 receives 5G band wireless signal, 5G band wireless signal can be completely received by the receiver RX through the choker 702 and the impedance inverter 704, instead of a part of 5G band wireless signal being inputted to the reference potential GND, and does not also be transmitted to the transmitter TX through the transmitting switch 40 or to the receiver RX through the IPC 20. In addition, in the antenna system 600, structures of the choker 702 and the impedance inverter 704 included in the IPC 30 are identical to structures of the choker 602 and the impedance inverter 604 of the IPC 20, so further description thereof is omitted for simplicity. In addition, coupling relationships between the choker 702, the impedance inverter 704, and the bypass switches S30 are identical to coupling relationships between the choker 602, the impedance inverter 604, and the bypass switch S20, so further description thereof is omitted for simplicity. Therefore, when the antenna 10 receives 2.4G band wireless signal corresponding to the IPC 20, the bypass switches S30, the bypass switch S20, and the transmitting switch 40 are turned off.

In addition, when the transmitter TX transmits 2.4G band wireless signal, the bypass switch S20 and the transmitting switch 40 are turned on and the bypass switches S30 is turned off to make 2.4G band wireless signal be transmitted by the antenna 10 through the transmitting switch 40, and the receiver RX does not receive 2.4G band wireless signal transmitted by the transmitter TX. That is to say, because the impedance inverter 604 can be seen as a transmission line corresponding to ¼ wavelength of 2.4G band wireless signal, when the bypass switch S20 is turned on (that is, the bypass switch S20 can be seen as a short circuit), the equivalent impedance of the IPC 20 seen from the antenna 10 is infinite according to the Smith chart, resulting in 2.4G band wireless signal transmitted by the transmitter TX not being inputted in the IPC 20. Similarly, when the transmitter TX transmits 5G band wireless signal, the bypass switches S30, the transmitting switch 40 are turned on and the bypass switch S20 is turned off to make 5G band wireless signal be transmitted by the antenna 10 through the transmitting switch 40. In addition, because the impedance inverter 704 can be seen as a transmission line corresponding to ¼ wavelength of 5G band wireless signal, when the bypass switches S30 is turned on (that is, the bypass switch S30 can be seen as a short circuit), the equivalent impedance of the IPC 30 seen from the antenna 10 is infinite according to the Smith chart, resulting in 5G band wireless signal transmitted by the transmitter TX not being inputted in the IPC 30. In addition, because a band of 5G band wireless signal is about two times (that is, even number times) a band of 2.4G band wireless signal, the impedance inverter 604 of the IPC 20 can also be seen as a transmission line corresponding to ½ wavelength of 5G band wireless signal (that is, a sum of two ¼ wavelengths corresponding to 5G band wireless signal). Thus, because the bypass switch S20 is turned off (that is, the bypass switch S20 can be seen as an open circuit), the equivalent impedance of the IPC 20 seen from the antenna 10 is infinite according to the Smith chart, resulting in 5G band wireless signal transmitted by the transmitter TX also not being inputted in the IPC 20. Because 5G band wireless signal transmitted by the transmitter TX cannot be inputted in the IPCs 20, 30, the receiver RX does not receive 5G band wireless signal transmitted by the transmitter TX.

Figure 7:
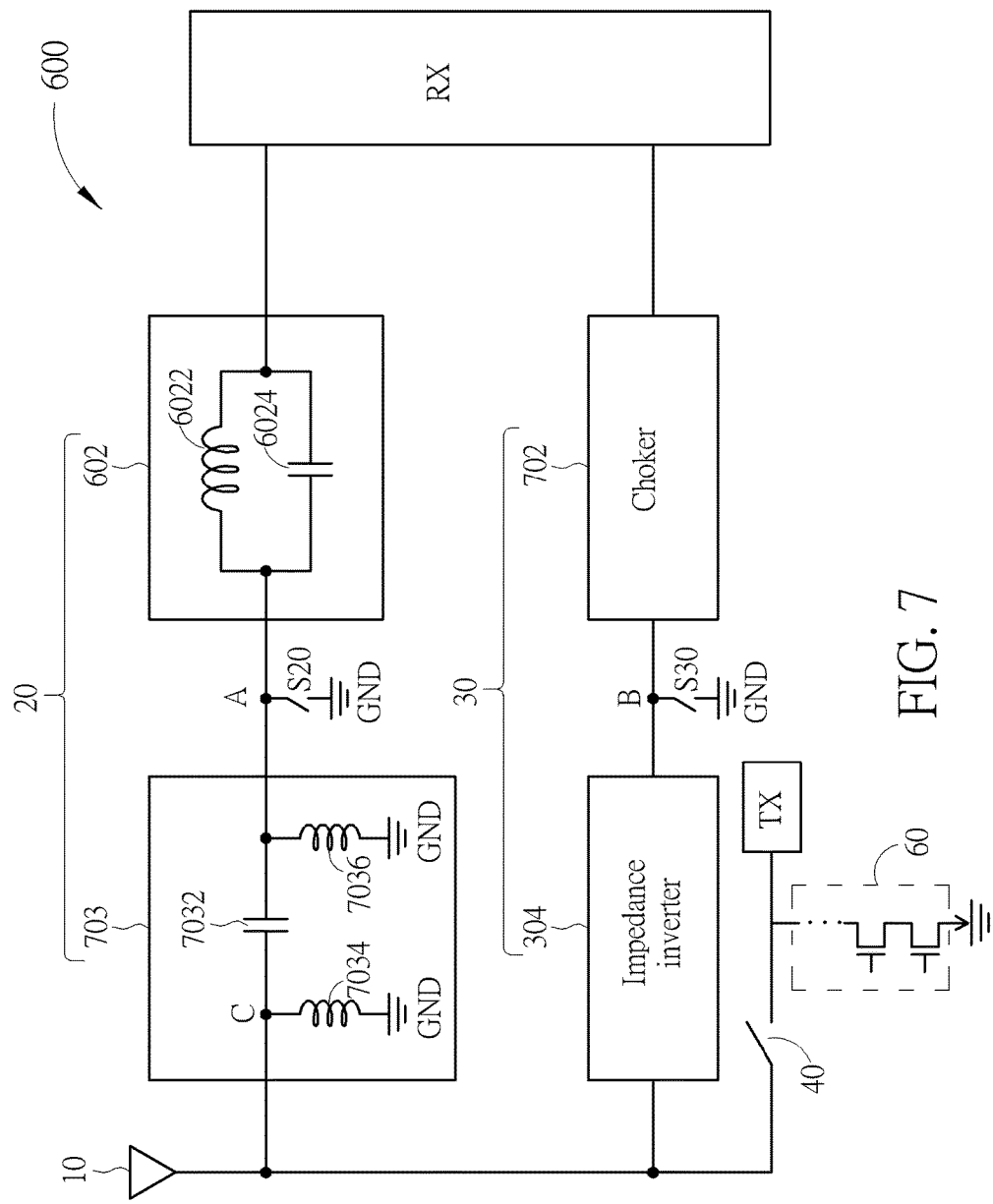
FIG. 7 is a diagram illustrating an impedance inverter applied to the antenna system according to a sixth embodiment of the present invention.

Please refer to FIG. 7. FIG. 7 is a diagram illustrating an impedance inverter 703 applied to the antenna system 600 according to a sixth embodiment of the present invention. As shown in FIG. 7, the impedance inverter 703 includes a second capacitor 7032, a second inductor 7034, and a third inductor 7036, wherein the second capacitor 7032 is coupled between a node A between the choker 602 and the bypass switch S20 and the antenna 10, the second inductor 7034 is coupled between anode C between the antenna 10 and the second capacitor 7032 and the reference potential, the third inductor 7036 is coupled between the node A between the choker 602 and the bypass switch S20 and the reference potential, and when the antenna 10 receives 2.4G band wireless signal, the impedance inverter 704 is equivalent to a high-pass π-type filter. Because operational principles of the impedance inverter 703 are identical to those of the impedance inverter 304, so further description thereof is omitted for simplicity.

Figure 8:
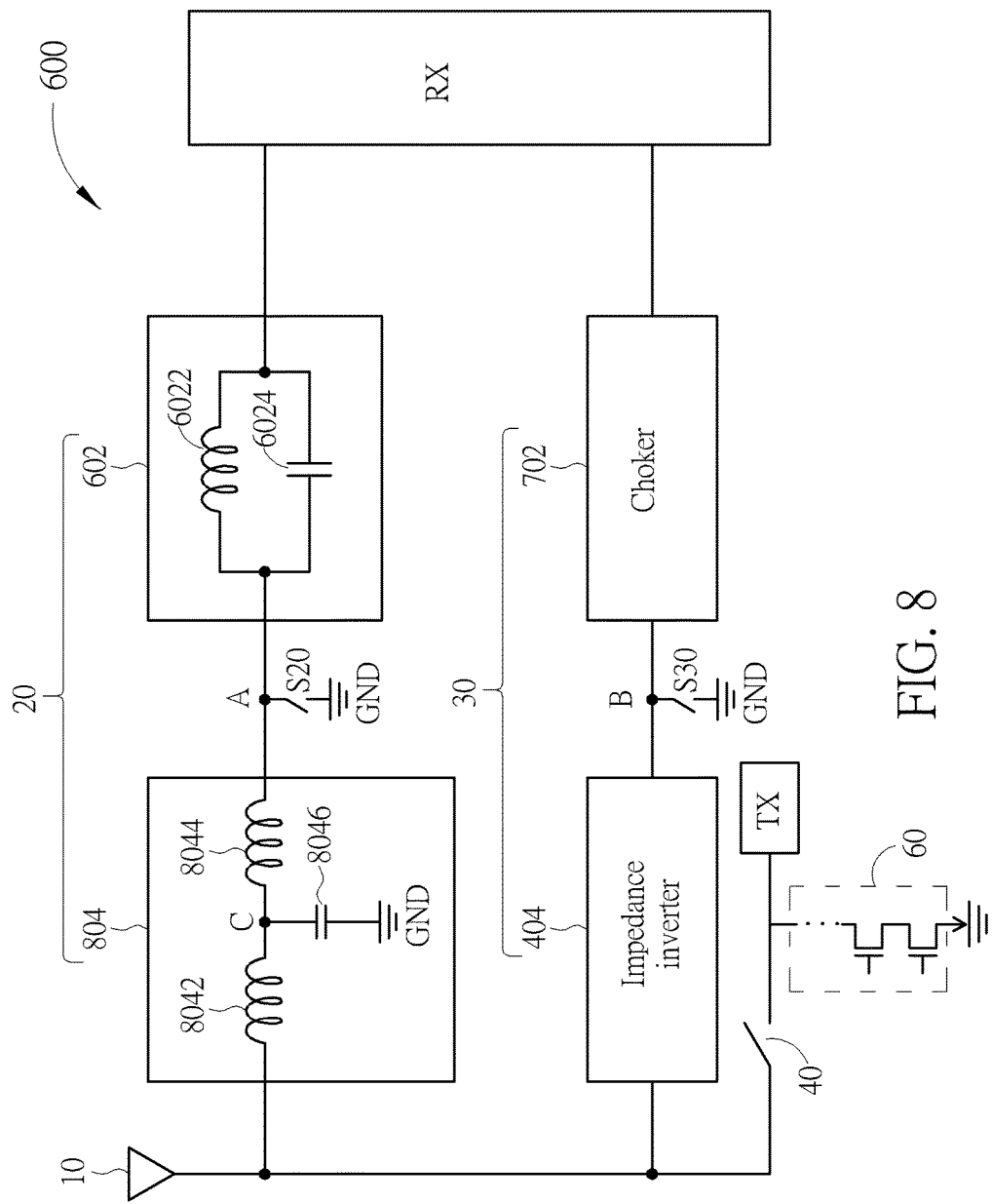
FIG. 8 is a diagram illustrating an impedance inverter applied to the antenna system according to a seventh embodiment of the present invention.

Please refer to FIG. 8. FIG. 8 is a diagram illustrating an impedance inverter 804 applied to the antenna system 600 according to a seventh embodiment of the present invention. As shown in FIG. 8, the impedance inverter 804 includes a second inductor 8042, a third inductor 8044, and a second capacitor 8046, wherein the second inductor 8042 is configured to couple to the antenna 10, the third inductor 8044 is coupled between a node A between the bypass switch S20 and the choker 602 and the second inductor 8042, the second capacitor 8046 is coupled between a node C between the second inductor 8042 and the third inductor 8044 and the reference potential, and when the antenna 10 receives 2.4G band wireless signal, the impedance inverter 804 is equivalent to a low-pass T-type filter. Because operational principles of the impedance inverter 804 are identical to those of the impedance inverter 404, so further description thereof is omitted for simplicity.

Figure 9:
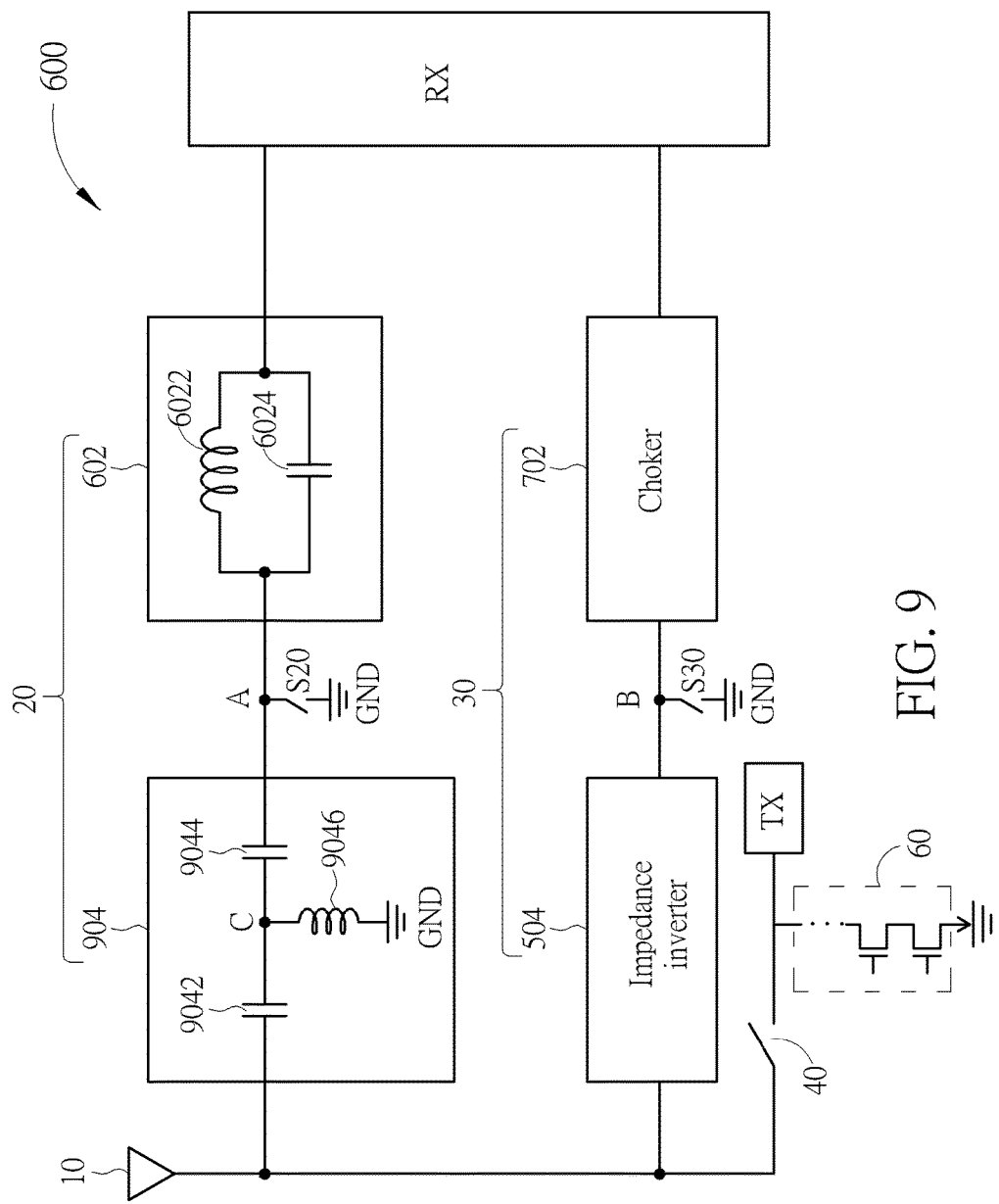
FIG. 9 is a diagram illustrating an impedance inverter applied to the antenna system according to an eighth embodiment of the present invention.

Please refer to FIG. 9. FIG. 9 is a diagram illustrating an impedance inverter 904 applied to the antenna system 600 according to an eighth embodiment of the present invention. As shown in FIG. 9, the impedance inverter 904 includes a second capacitor 9042, a third capacitor 9044, and a second inductor 9046, wherein the second capacitor 9042 is configured to couple to the antenna 10, the third capacitor 9044 is coupled between a node A between the bypass switch S20 and the choker 602 and the second capacitor 9042, and the second inductor 9046 is coupled between a node C between the second capacitor 9042 and the third capacitor 9044 and the reference potential, and when the antenna 10 receives 2.4G band wireless signal, the impedance inverter 904 is equivalent to a T-type filter. Because operational principles of the impedance inverter 904 are identical to those of the impedance inverter 504, so further description thereof is omitted for simplicity.

Figure 10:
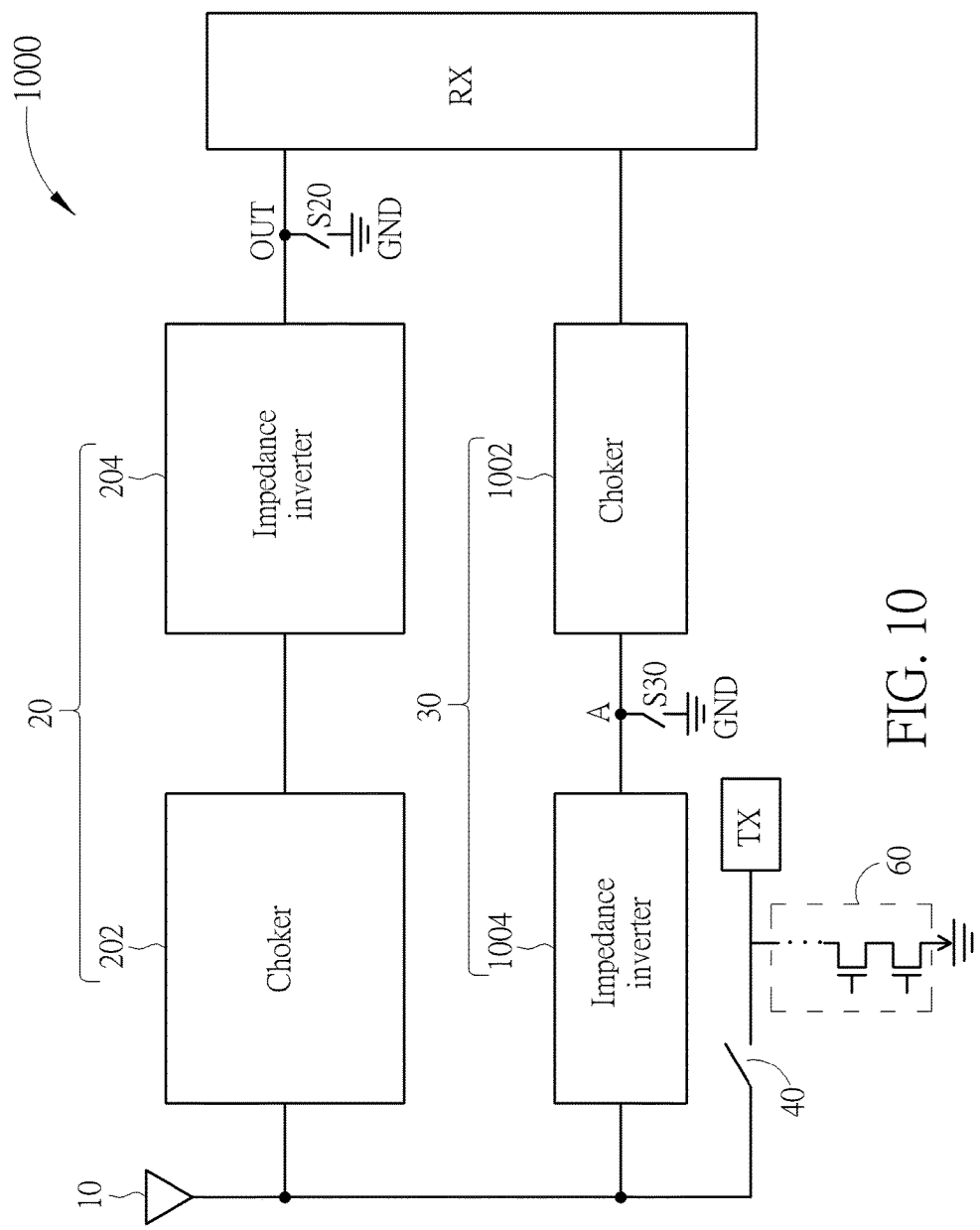
FIG. 10 is a diagram illustrating an antenna system for receiving and transmitting wireless signals according to a ninth embodiment of the present invention.

Please refer to FIG. 10. FIG. 10 is a diagram illustrating an antenna system 1000 for receiving and transmitting wireless signals according to a ninth embodiment of the present invention. As shown in FIG. 10, differences between the antenna system 1000 and the antenna system 200 are that an impedance inverter 1004 included in the IPC 30 is coupled between a choker 1002 included in the IPC 30 and the antenna 10, the choker 1002 included in the IPC 30 is coupled between the impedance inverter 1004 and the receiver RX, the bypass switches S30 is coupled between a node A between the impedance inverter 1004 and the choker 1002 and the reference potential, and a band of the band wireless signal corresponding to the IPC 30 (e.g. 5G band wireless signal) is about two times (that is, even number times) a band of the band wireless signal corresponding to the IPC 20 (e.g. 2.4G band wireless signal). In addition, in the antenna system 1000, structures and operational principles of the choker 1002 and the impedance inverter 1004 includes the IPC 30 are identical to those of the choker 702 and the impedance inverter 704 included in the IPC 30 shown in FIG. 6, so further description thereof is omitted for simplicity. In addition, in the antenna system 1000, structures and operational principles of the choker 202 and the impedance inverter 204 included in the IPC 20 are identical to those of the choker 202 and the impedance inverter 204 of the IPC 20 shown in FIG. 2, so further description thereof is omitted for simplicity.

Therefore, operational principles of the antenna system 1000 can be referred to the above mentioned operational principles of the antenna system 200 and the antenna system 600, so when the antenna 10 receives 2.4G band wireless signal, the bypass switch S20, the bypass switches S30, and the transmitting switch 40 are turned off; when the antenna 10 receives 5G band wireless signal corresponding to the IPC 30, the bypass switches S30 is turned off, the transmitting switch 40 is turned off, and the bypass switch S20 is optionally turned on; when the transmitter TX transmits 2.4G band wireless signal, the bypass switch S20 and the transmitting switch 40 are turned on, and the bypass switches S30 is turned off; and when the transmitter TX transmits 5G band wireless signal, the bypass switches S30 and the transmitting switch 40 are turned on, and the bypass switch S20 is also optionally turned on or turned off.

Figure 11:
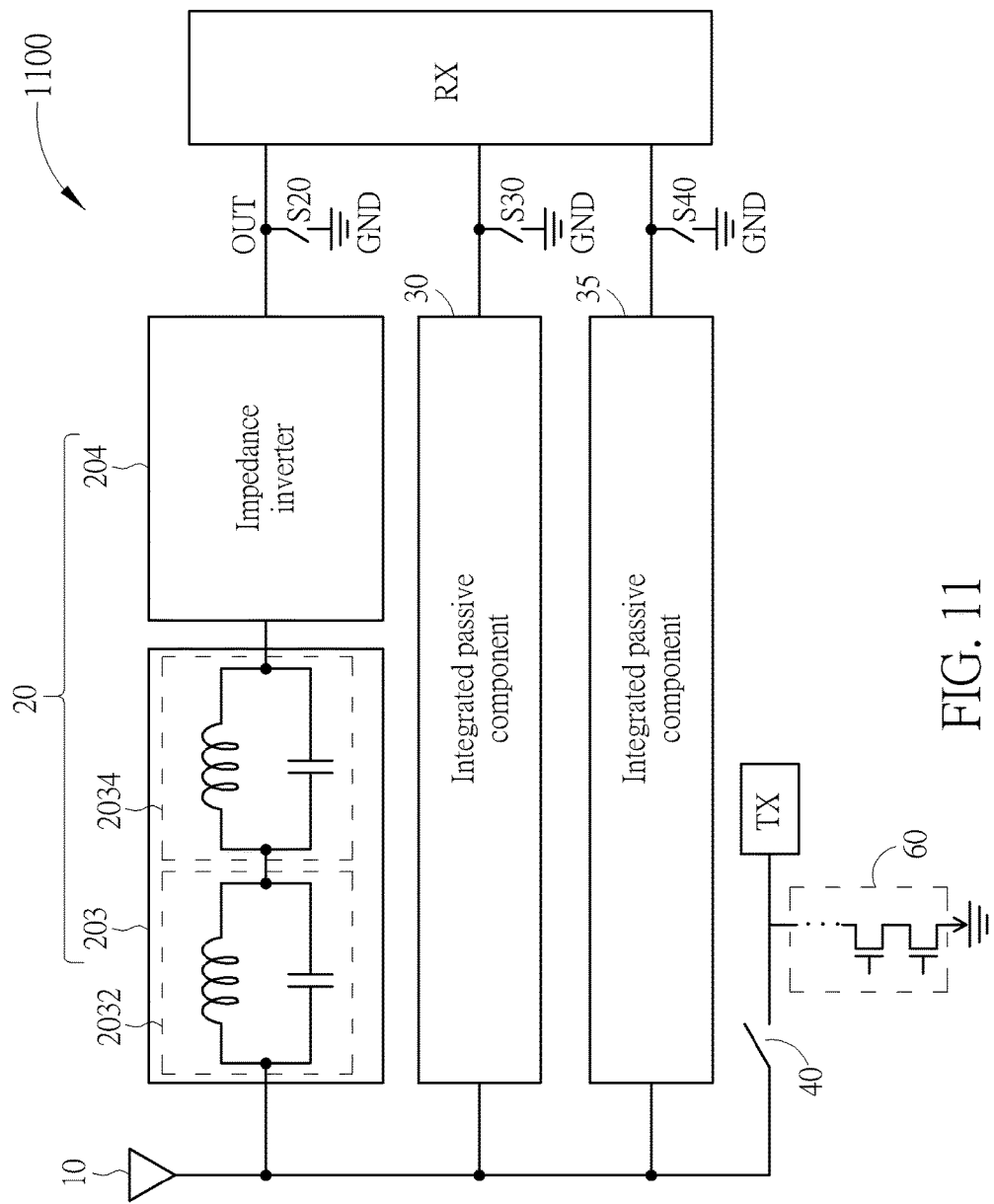
FIG. 11 is a diagram illustrating an antenna system for receiving and transmitting wireless signals according to a tenth embodiment of the present invention.

Please refer to FIG. 11. FIG. 11 is a diagram illustrating an antenna system 1100 for receiving and transmitting wireless signals according to a tenth embodiment of the present invention. As shown in FIG. 11, a difference between the antenna system 1100 and the antenna system 200 is that the antenna system 1100 further includes an IPC 35, wherein a band wireless signal corresponding to the IPC 35 is different from 2.4G band wireless signal and 5G band wireless signal, e.g. the IPC 35 corresponds to 10G band wireless signal. Because the antenna system 1100 further includes the IPC 35, the choker 203 included in the IPC 20 includes two choke units 2032, 2034, wherein each choke unit of the choke units 2032, 2034 is used for choking a corresponding band wireless signal of 5G band wireless signal and 10G band wireless signal, and the choke units 2032, 2034 are serially connected to each other. In addition, as shown in FIG. 11, structures and operational principles of each choke unit of the choke units 2032, 2034 and the impedance inverter 204 are identical to those of the choker 202 and the impedance inverter 204 of the antenna system 200, respectively, so further description thereof is omitted for simplicity. In addition, operational principles of the antenna system 1100 can be referred to the above mentioned operational principles of the antenna system 200, so further description thereof is omitted for simplicity.

Figure 12:
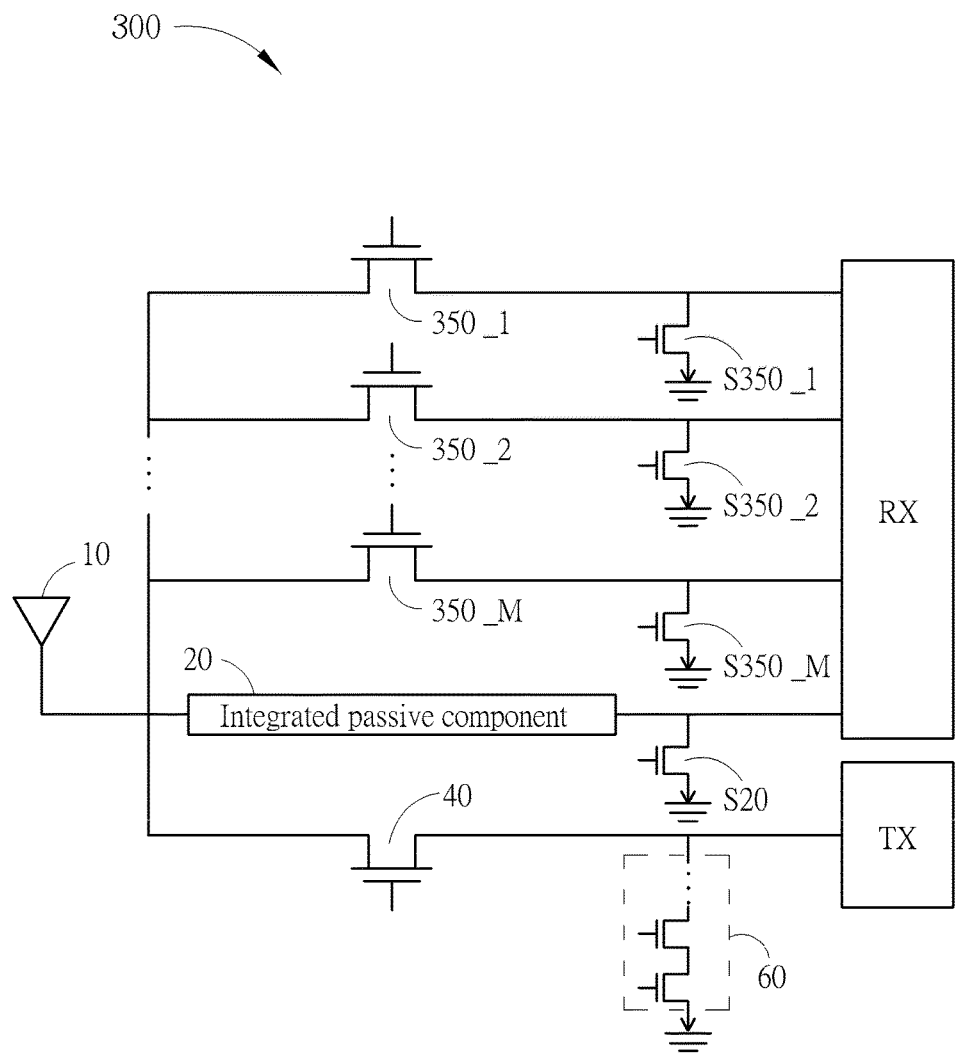
FIG. 12 is a diagram illustrating an antenna system according to an eleventh embodiment of the present invention.

Please refer to FIG. 12. FIG. 12 is a diagram illustrating an antenna system 300 according to an eleventh embodiment of the present invention. The antenna system 300 includes an antenna 10, M receiving switches 350_1 to 350_M, an IPC 20, a transmitting switch 40, a receiver RX, a transmitter TX, the bypass switches S20 and S350_1 to S350_M, and a set of serially connected switches 60. A first end of each receiving switch of the M receiving switches 350_1 to 350_M is configured to couple to the antenna 10 for receiving wireless signals from the antenna 10 when the receiving switch is turned on. The IPC 20 has a first end configured to couple to the antenna 10, for receiving the band wireless signal corresponding to the IPC 20 and filtering other band wireless signals corresponding to the M receiving switches 350_1 to 350_M. The transmitting switch 40 has a first end configured to couple to the antenna 10 for transmitting wireless signals to the antenna 10. M is a positive integer.

Similarly to the first embodiment of the present invention, in FIG. 12, the bypass switch S20 is coupled between a second end of the IPC 20 and the reference potential, and each bypass switch of the bypass switches S350_1 to S350_M is coupled between a second end of each receiving switch of the M receiving switches 350_1 to 350_M and the reference potential. Each of turning-on impedances of the bypass switches S20 and S350_1 to S350_M is larger than ten times turning-on impedance of the transmitting switch 40. Besides, gate widths of the bypass switches S20 and S350_1 to S350_M can be configured to be much smaller than those of ordinary RF switches, e.g. the transmitting switch 40. Thus, the bypass switches S20 and S350_1 to S350_M have smaller areas, compared to the ordinary RF switches, and parasitic capacitance effects of the bypass switches S20 and S350_1 to S350_M will not be significant.

The receiver RX is coupled to the second ends of the IPC 20 and of each receiving switch of the M receiving switches 350_1 to 350_M, for processing signals received from the IPC 20 and the M receiving switches 350_1 to 350_M. The transmitter TX is coupled to a second end of the transmitting switch 40, for generating and transmitting wireless signals to the antenna 10 through the transmitting switch 40.

When the transmitter TX transmits a band wireless signal corresponding to one of the IPC 20 and the M receiving switches 350_1 to 350_M, the bypass switch S20 and the transmitting switch 40 are turned on, and the M receiving switches 350_1 to 350_M will be all turned off, so that wireless signals can be transmitted by the antenna 10 through the transmitting switch 40 and wireless signals transmitted from the IPC 20 to the receiver RX will be shorted to the reference potential. And, the receiver RX will not receive wireless signals from the transmitter TX by turning off the M receiving switches 350_1 to 350_M. Furthermore, the bypass switches S350_1 to S350_M can be turned on to ensure that the second end of each of the M receiving switches 350_1 to 350_M is shorted to the reference potential.

When the receiver RX receives the band wireless signal corresponding to the IPC 20 from the antenna 10, the bypass switch S20, the transmitting switch 40, and the M receiving switches 350_1 to 350_M are turned off, so that the band wireless signal corresponding to the IPC 20 can be fully received by the receiver RX via the IPC 20 without being shorted to the reference potential, and will not be transmitted to the transmitter TX through the transmitting switch 40 or to the receiver RX through the M receiving switches 350_1 to 350_M. Further, the bypass switches S350_1 to S350_M can also be turned on to ensure that the second end of each receiving switch of the M receiving switches 350_1 to 350_M is shorted to the reference potential.

When the receiver RX receives a band wireless signal corresponding to one of the M receiving switches 350_1 to 350_M, e.g. the receiving switch 350_1, the bypass switch S350_1, the transmitting switch 40, and the receiving switches 350_2 to 350_M are turned off, so that a band wireless signal corresponding to the receiving switch 350_1 can be fully received by the receiver RX via the receiving switch 350_1 without being shorted to the reference potential, and will not be transmitted to the transmitter TX through the transmitting switch 40 or to the receiver RX through the receiving switches 350_2 to 350_M or IPC 20. Further, the bypass switches S350_2 to S350_M and S20 can also be turned on to ensure that the second ends of the IPC 20 and each receiving switch of the receiving switches 350_2 to 350_M are shorted to the reference potential.

Similar to the first embodiment of the present invention, when the antenna system 300 receives or transmits the band wireless signals corresponding to the IPC 20 or a band wireless signals corresponding to one of the M receiving switches 350_1 to 350_M, the antenna system 300 can filter other band wireless signals to the receiver RX and all band wireless signals from the transmitter TX to the receiver RX to prevent various band wireless signals from interfering with each other. Besides, the bypass switches S350_1 to S350_M and S20 have high turning-on impedances and smaller gate widths, the bypass switches S350_1 to S350_M and S20 have lower parasitic capacitance effects. Moreover, these above mentioned components can be integrated into an IC to reduce the parasitic capacitance effect further.

Figure 13:
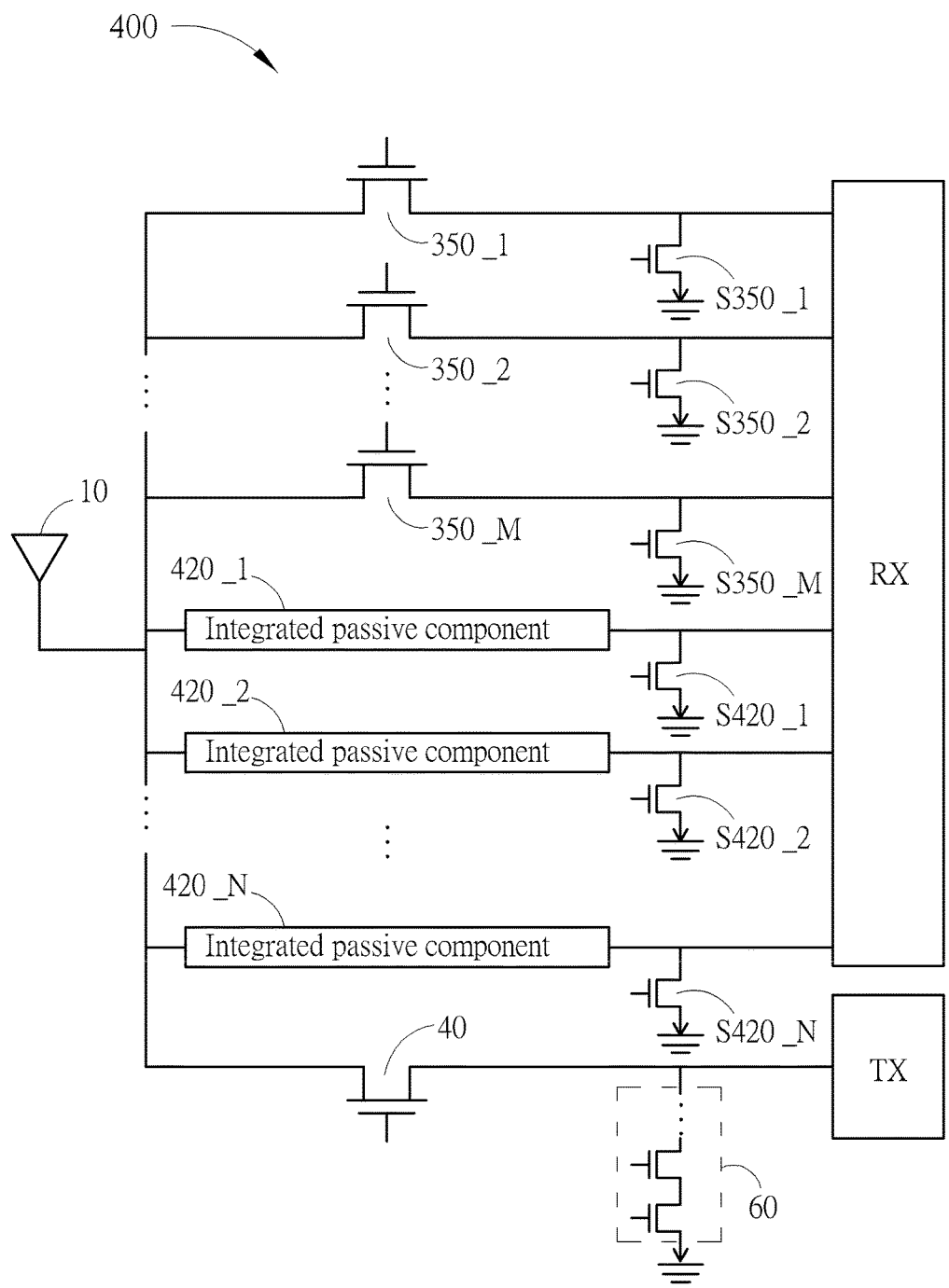
FIG. 13 is a diagram illustrating an antenna system according to a twelfth embodiment of the present invention.

Please refer to FIG. 13. FIG. 13 is a diagram illustrating an antenna system 400 according to a twelfth embodiment of the present invention. The antenna system 400 includes an antenna 10, M receiving switches 350_1 to 350_M, N IPCs 420_1 to 420_N, a transmitting switch 40, the bypass switches S420_1 to S420_N and S350_1 to S350_M, and a set of serially connected switches 60. A first end of each receiving switch of the M receiving switches 350_1 to 350_M is configured to couple to the antenna 10, for receiving wireless signals from the antenna 10 when the receiving switch is turned on. Each IPC of the IPCs 420_1 to 420_N has a first end configured to couple to the antenna 10, and is used for receiving a corresponding band wireless signal and filtering other band wireless signals corresponding to other IPCs of the IPCs 420_1 to 420_N and the receiving switches 350_1 to 350_M. The transmitting switch 40 has first end configured to couple to the antenna 10 for transmitting wireless signals to the antenna 10. In FIG. 13, M is a positive integer, and N is an integer larger than 1.

Each bypass switch of the bypass switches S350_1 to S350_M is coupled between a second end of the corresponding one of the M receiving switches 350_1 to 350_M and the reference potential, and each bypass switch of the bypass switches S420_1 to S420_N is coupled between a second end of each IPC of the IPCs 420_1 to 420_N and the reference potential. Each of turning-on impedances of the bypass switches S420_1 to S420_N and S350_1 to S350_M is larger than ten times turning-on impedance of the transmitting switch 40. Besides, gate widths of the bypass switches S420_1 to S420_N and S350_1 to S350_M can be configured to be much smaller than those of ordinary RF switches, e.g. the transmitting switch 40. Thus, the bypass switches S420_1 to S420_N and S350_1 to S350_M have smaller areas, compared to the ordinary RF switches, and parasitic capacitance effects of the bypass switches S420_1 to S420_N and S350_1 to S350_M will not be significant.

The receiver RX is coupled to the second end of each IPC of the IPCs 420_1 to 420_N and of each receiving switch of the receiving switches 350_1 to 350_M, for processing wireless signals received from IPCs 420_1 to 420_N or receiving from the receiving switches 350_1 to 350_M. The transmitter TX is coupled to a second end of the transmitting switch 40, for generating and transmitting wireless signals to the antenna 10 through the transmitting switch 40.

When the transmitter TX transmits a band wireless signal corresponding to one of the IPCs 420_1 to 420_N and the receiving switches 350_1 to 350_M, the bypass switches S420_1 to S420_N and the transmitting switch 40 are turned on, and the receiving switches 350_1 to 350_M are all turned off, so that wireless signals can be transmitted by the antenna 10 through the transmitting switch 40. Besides, wireless signals via the IPCs 420_1 to 420_N to the receiver RX will be shorted to the reference potential. Thus, the receiver RX will not be affected by wireless signals transmitted from the transmitter TX. Further, the bypass switches S350_1 to S350_M can be turned on to ensure that the second end of each of the receiving switches 350_1 to 350_M is shorted to the reference potential.

When the receiver RX receives a band wireless signal corresponding to one of the IPCs 420_1 to 420_N, e.g. 420_1, from the antenna 10, the bypass switch S420_1, the transmitting switch 40, and the receiving switches 350_1 to 350_M are turned off, and the bypass switches S420_2 to S420_N are all turned on, so that the band wireless signal corresponding to the IPC 420_1 can be fully received by the receiver RX via the IPC 420_1 without being shorted to the reference potential, and will not be transmitted to the transmitter TX through the transmitting switch 40 or to the receiver RX through the IPCs 420_2 to 420_N and the receiving switches 350_1 to 350_M. Besides, the bypass switches S350_1 to S350_M can also be turned on to ensure that the second end of each receiving switch of the receiving switches 350_1 to 350_M is shorted to the reference potential.

When the receiver RX is receiving a band wireless signal corresponding to one receiving switch of the receiving switches 350_1 to 350_M, e.g. the receiving switch 350_1, the bypass switch S350_1, the transmitting switch 40, and the receiving switches 350_2 to 350_M are turned off, and the bypass switches S420_1 to S420_N are turned on, so that the band wireless signal corresponding to the receiving switch 350_1 can be fully received by the receiver RX via the receiving switches 350_1 without being shorted to the reference potential, and will not be transmitted to the transmitter TX through the transmitting switch 40 or to the receiver RX through the IPCs 420_1 to 420_N and the receiving switches 350_2 to 350_M. Besides, the bypass switches S350_2 to S350_M can also be turned on to ensure that the second end of each receiving switch of the receiving switches 350_2 to 350_M is shorted to the reference potential.

Similar to the first embodiment of the present invention, when the antenna system 400 receives or transmits a band wireless signal corresponding to one of the IPCs 420_1 to 420_N and the receiving switches 350_1 to 350_M, the antenna system 400 can filter other band wireless signals to the receiver RX and all band wireless signals from the transmitter TX to the receiver RX to prevent various band wireless signals from interfering with each other and improve nonlinear distortion. Besides, the bypass switches S420_1 to S420_N and S350_1 to S350_M have high turning-on impedances and small gate widths, thus reducing parasitic capacitance effects. Moreover, these above mentioned components can be integrated into an IC to reduce the parasitic capacitance effect further.

In view of above, through utilizing the antenna systems of the present invention, the antenna systems of the present invention can prevent various band wireless signals from interfering with each other to improve nonlinear distortion of the antenna systems of the present invention. In addition, the antenna systems of the present invention can also reduce parasitic capacitance effect.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An antenna system for receiving and transmitting wireless signals, comprising:
    N integrated passive components (IPCs), wherein an IPC of the N IPCs is configured to couple to an antenna for receiving a first band wireless signal from the antenna and filtering other band wireless signals corresponding to other IPCs of the N IPCs, wherein the IPC comprises:
        a choker for choking the other band wireless signals; and
        an impedance inverter coupled to the choker and the impedance inverter having an electrical length corresponding to ¼ wavelength of the first band wireless signal;
    N bypass switches, wherein a bypass switch corresponding to the IPC is coupled to the IPC and the bypass switch is configured to be optionally turned on for further completely filtering the other band wireless signals;
    a transmitting switch coupled between the antenna and a transmitter;
    a receiver coupled to the N IPCs and configured to receive the first band wireless signal from the antenna through the IPC; and
    the transmitter configured to transmit a second band wireless signal to the antenna through the transmitting switch when the transmitting switch is turned on;
    wherein N is an integer greater than 1.

2. The antenna system of claim 1, wherein the choker is coupled between the impedance inverter and the antenna, the bypass switch is coupled between an output terminal of the impedance inverter and a reference potential, and when the antenna receives the first band wireless signal, the corresponding bypass switch is turned off.

3. The antenna system of claim 2, wherein the choker comprises:
    a first inductor coupled between the impedance inverter and the antenna; and
    a first capacitor connected to the first inductor in parallel.

4. The antenna system of claim 3, wherein the impedance inverter is equivalent to a π-type filter when operating at the first band wireless signal, wherein the π-type filter comprises:
    a second inductor coupled between the choker and the bypass switch;
    a second capacitor coupled between a node between the choker and the second inductor and the reference potential; and
    a third capacitor coupled between the second inductor and the reference potential.

5. The antenna system of claim 3, wherein the impedance inverter is equivalent to a π-type filter when operating at the first band wireless signal, wherein the π-type filter comprises:
    a second capacitor coupled between the choker and the bypass switch;
    a second inductor coupled between a node between the choker and the second capacitor and the reference potential; and
    a third inductor coupled between the second capacitor and the reference potential.

6. The antenna system of claim 3, wherein the impedance inverter is equivalent to a T-type filter when operating at the first band wireless signal, wherein the T-type filter comprises:
    a second inductor coupled to the choker;
    a third inductor coupled between the second inductor and the bypass switch; and
    a second capacitor coupled between a node between the second inductor and the third inductor and the reference potential.

7. The antenna system of claim 3, wherein the impedance inverter is equivalent to a T-type filter when operating at the first band wireless signal, wherein the T-type filter comprises:
    a second capacitor coupled to the choker;
    a third capacitor coupled between the second capacitor and the bypass switch; and
    a second inductor coupled between a node between the second capacitor and the third capacitor and the reference potential.

8. The antenna system of claim 2, further comprising:
    a set of serially connected switches coupled between the transmitting switch and the reference potential.

9. The antenna system of claim 2, wherein the choker comprises at least two choke units, each choke unit of the at least two choke units is used for choking a corresponding wireless signal of the other band wireless signals, and the at least two choke units are serially connected to each other.

10. The antenna system of claim 1, wherein when the antenna receives the first band wireless signal, the bypass switch and the transmitting switch are turned off; and when the transmitter transmits the second band wireless signal to the antenna, the bypass switch and the transmitting switch are turned on.

11. The antenna system of claim 1, wherein the impedance inverter is coupled between the choker and the antenna, and the bypass switch of the N bypass switches is coupled between a node between the impedance inverter and the choker and a reference potential.

12. The antenna system of claim 11, further comprising:
    a set of serially connected switches coupled between the transmitting switch and the reference potential.

13. The antenna system of claim 1, wherein when the antenna receives the first band wireless signal, the N bypass switches and the transmitting switch are turned off; when the transmitter transmits the second band wireless signal to the antenna, the bypass switch and the transmitting switch are turned on and other bypass switches of the N bypass switches different from the bypass switch are turned off, wherein bands of the other band wireless signals are even number times a band of the first band wireless signal.

14. The antenna system of claim 1, wherein a choker of each first IPC of at least one first IPC of the N IPCs is coupled between an impedance inverter of the each first IPC and the antenna, and an impedance inverter of each second IPC of other second IPCs of the N IPCs different from the at least one first IPC is coupled between a choker of the each second IPC and the antenna, wherein a first bypass switch of the N bypass switches corresponding to the each first IPC is coupled between an output terminal of the impedance inverter of the each first IPC and a reference potential, and a second bypass switch of the N bypass switches corresponding to the each second IPC is coupled between a node between the impedance inverter of the each second IPC and the choker of the each second IPC and the reference potential.

15. The antenna system of claim 14, further comprising:
a set of serially connected switches coupled between the transmitting switch and the reference potential.

16. The antenna system of claim 1, wherein when the antenna receives a first predetermined band wireless signal corresponding to the each first IPC, the N bypass switches and the transmitting switch are turned off; when the antenna receives a second predetermined band wireless signal corresponding to the each second IPC, the second bypass switch and the transmitting switch are turned off; when the antenna transmits the first predetermined band wireless signal corresponding to the each first IPC, the first bypass switch and the transmitting switch are turned on, and the second bypass switch is turned off; and when the antenna transmits the second predetermined band wireless signal corresponding to the each second IPC, the second bypass switch and the transmitting switch are turned on, wherein a band of the second predetermined band wireless signal is even number times a band of the first predetermined band wireless signal.

17. The antenna system of claim 1, wherein the choker is not directly electrically connected to a reference potential.

* * * * *